(12) United States Patent
Oh et al.

(10) Patent No.: US 10,018,786 B2
(45) Date of Patent: Jul. 10, 2018

(54) RESONATOR AND OPTICAL SENSOR USING THE SAME FOR DETECTING A BEATING SIGNAL CAUSED BY INTERFERENCE OF TWO OUTPUT BEAMS FROM FIRST AND SECOND RESONATORS

(71) Applicant: ELECTRONICS AND TELECOMMUNICATIONS RESEARCH INSTITUTE, Daejeon (KR)

(72) Inventors: Kwang Ryong Oh, Daejeon (KR); Hong-Seung Kim, Sejong-si (KR)

(73) Assignee: ELECTRONICS AND TELECOMMUNICATIONS RESEARCH INSTITUTE, Daejeon (KR)

(*) Notice: Subject to any disclaimer, the term of this patent is extended or adjusted under 35 U.S.C. 154(b) by 41 days.

(21) Appl. No.: 15/228,014

(22) Filed: Aug. 4, 2016

(65) Prior Publication Data
US 2017/0212306 A1  Jul. 27, 2017

(30) Foreign Application Priority Data
Jan. 26, 2016 (KR) .................. 10-2016-0009629

(51) Int. Cl.
| | |
|---|---|
| *H01P 7/00* | (2006.01) |
| *G02B 6/293* | (2006.01) |
| *G01D 5/353* | (2006.01) |
| *G02B 6/124* | (2006.01) |
| *G02B 6/136* | (2006.01) |
| *G02B 6/32* | (2006.01) |
| *H01S 5/10* | (2006.01) |

(Continued)

(52) U.S. Cl.
CPC ...... *G02B 6/29341* (2013.01); *G01D 5/35319* (2013.01); *G02B 6/124* (2013.01); *G02B 6/136* (2013.01); *G02B 6/32* (2013.01); *H01S 5/1075* (2013.01); *H01S 5/3013* (2013.01); *G02B 2006/12104* (2013.01)

(58) Field of Classification Search
CPC .... G01D 5/35319; G02B 6/124; G02B 6/136; G02B 6/29341; G02B 6/32; H01P 7/00
USPC ............. 250/231.12, 216; 356/459, 461
See application file for complete search history.

(56) References Cited

U.S. PATENT DOCUMENTS

| | | | |
|---|---|---|---|
| 6,603,557 B2 * | 8/2003 | Mizutani | G01C 19/66 250/231.12 |
| 2010/0328774 A1 | 12/2010 | Hong et al. | |
| 2014/0050621 A1 | 2/2014 | Yu et al. | |

FOREIGN PATENT DOCUMENTS

| | | |
|---|---|---|
| KR | 10-2006-0025419 A | 3/2006 |
| KR | 10-2011-0059108 A | 6/2011 |

OTHER PUBLICATIONS

D.Rafizadeh et al., "Waveguide-coupled AlGaAs/GaAs microcavity ring and disk resonators with high finesse and 21.6-nm free spectral range", Optics Letters, vol. 22, No. 16, pp. 1244-1246, Aug. 15, 1997.

(Continued)

*Primary Examiner* — Que T Le
(74) *Attorney, Agent, or Firm* — Rabin & Berdo, P.C.

(57) ABSTRACT

There is provided a semi-circular resonator using a whispering gallery mode (WGM) and an optical sensor using the same. Accordingly, an active region that is a waveguide of an active layer in which laser oscillation is caused by gains of advancing beams is deeply etched in a semi-circular or semi-ring shape.

13 Claims, 5 Drawing Sheets

(51) Int. Cl.
*H01S 5/30*   (2006.01)
*G02B 6/12*   (2006.01)

(56) References Cited

OTHER PUBLICATIONS

Jun Yang et al., "Optical Sensors Based on Active Microcavities", IEEE Journal of Selected Topics in Quantum Electronics, vol. 12, No. 1, pp. 143-147, Feb. 2006.
Myung-Woon Kim et al., "Directional single mode emission in a microcavity laser", Optics Express, vol. 20, No. 13, pp. 13651-13656, Jun. 18, 2012.
Kwang Ryong Oh, "A Review of Label-Free Biosensing Optical Integrated Devices", 2013 Electronics and Telecommunications Trends, vol. 28, No. 5, pp. 57-71, Oct. 2013.
Hong-Seung Kim et al., "A novel high sensitive laser diode sensor based on micro-cavity", Proc. of SPIE, vol. 9750, 97501R, 2016.

\* cited by examiner

RESONATOR AND OPTICAL SENSOR USING THE SAME FOR DETECTING A BEATING SIGNAL CAUSED BY INTERFERENCE OF TWO OUTPUT BEAMS FROM FIRST AND SECOND RESONATORS

CROSS-REFERENCE TO RELATED APPLICATION

The present application claims priority to Korean patent application number 10-2016-0009629 filed on Jan. 26, 2016, the entire disclosure of which is herein incorporated by reference in its entirety.

BACKGROUND

1. Field

An aspect of the present disclosure relates to a resonator and an optical sensor using the same, and more particularly, to a semi-circular resonator using a whispering gallery mode (WGM) and an optical sensor using the same.

2. Description of the Related Art

A whispering gallery mode (WGM) has the form of a wave that is continuously totally reflected from an inner surface of a spherical or circular resonator to circulate in the resonator. In general, the intensity of a wave in a free space decreases in proportion to the square of a distance from an epicenter. However, the intensity of the WGM decreases in proportion to a distance in a thin layer adjacent to the inner surface of the resonator, which has a characteristic similar to that when a wave advances along a linear waveguide.

As a result, the resonator using the WGM has a high quality factor ($Q=\lambda/\Delta\lambda$), a low mode volume, and a small size. Hence, the resonator using the WGM is used in various sensors and has aroused a lot of interest.

Nevertheless, a majority of optical sensors using typical resonators are passive sensors and require external light sources. Therefore, optical coupling with fine alignment between an input/output optical fiber and a resonator is required to achieve an optical connection between an external light source and the resonator.

A typical resonator is based on a circular shape, and hence, when an optical fiber is optically coupled to the resonator, the optical fiber should be finely adjusted to μm or less in terms of the resonator. In addition, if the position between the optical fiber and the resonator is changed, the Q-factor of the resonator is changed. As a result, an optical sensor using the typical resonator cannot perform measurement even when a minute vibration occurs. Hence, the optical sensor may be used in a laboratory, but there is a limitation in commercialization.

In the case of a PLC-based ring or disk resonator, an optical coupling waveguide for evanescent waves of the resonator can be integrated, and stable characteristics can be ensured. Thus, the resonator has been partially commercialized. However, the Q-factor of the resonator is lowered due to optical coupling, and there is a limitation in ensuring uniformity.

In the case of a deformed micro-disk resonator in which oscillation in a single direction is implemented by deforming the shape of an extremely small portion of a circular resonator, the Q-factor of the resonator is not lowered due to optical coupling between an input/output optical fiber and the resonator, and fine alignment is not required. Thus, it is possible to implement a resonator having a high Q-factor. However, there is required a technique for designing a very fine resonator, and the tolerance in the manufacturing of a designed resonator is very small, which requires a high-level lithography and etching technique. In addition, as there occurs very low outputs that are not adjusted due to characteristics of the resonator having a high Q-factor, signal processing is problematic when the resonator is practically applied.

SUMMARY

Embodiments provide a high-resolution and high-sensitivity resonator for biological and chemical sensing, and an optical sensor using the same.

Embodiments also provide a resonator and an optical sensor using the same, which can overcome a limit of high resolution and high sensitivity of typical resonators, and can be relatively simply manufactured and driven.

According to an aspect of the present disclosure, there is provided a resonator including: a semiconductor active region having a plurality of quantum wells, which is formed by alternately stacking a first layer having a high bandgap energy and a second layer having a low bandgap energy; and semiconductor cladding layers having a higher energy than the active region, which are respectively located on the top and bottom of the active region, wherein the active region is deeply etched in a semi-circular or semi-ring shape from cutting plane.

According to an aspect of the present disclosure, there is provided an optical sensor including a resonator configured with a waveguide deeply etched down to a substrate in a semi-circular or semi-ring shape, wherein some of beams totally reflected from a circular arc of the semi-circular or semi-ring-shaped waveguide to form a whispering gallery mode (WGM) are output through one end section of the semi-circular or semi-ring-shaped waveguide.

According to an aspect of the present disclosure, there is provided an optical sensor including: reference and sensing resonators each configured with a waveguide formed in a semi-circular or semi-ring shape; and an optical detector for a beating signal through coupling of output beams output from the resonators, wherein the output beams are some of beams forming a WGM, which are output through a cutting plane of the semi-circular or semi-ring-shaped waveguide.

According to an aspect of the present disclosure, there is provided an optical sensor including: first and second resonators each formed to have a shape in which a waveguide is etched in a semi-circular or semi-ring shape from a section thereof; an optical detector for detecting a beating signal caused by interference of two output beams output from the first and second resonators; and a lens for refracting the two output beams.

According to an aspect of the present disclosure, there is provided an optical sensor including: first and second resonators each formed to have a shape in which a waveguide is etched in a semi-circular or semi-ring shape from a section thereof; an optical detector for detecting a beating signal caused by interference of two output beams output from the first and second resonators; distributed bragg gratings for the effective reflection of WGM; and a coupler for coupling beams output from the distributed bragg gratings, thereby outputting the beating signal.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

In the following description, detailed explanation of known related functions and constitutions may be omitted to avoid unnecessarily obscuring the subject manner of the present disclosure.

It will be understood that when an element is referred to as being "connected" or "coupled" to another element, it can be directly connected or coupled to the other element or intervening elements may also be present. In contrast, when an element is referred to as being "directly connected" or "directly coupled" to another element, no intervening elements are present.

It will be further understood that terms such as "including" or "having," etc., are intended to indicate the existence of the features, numbers, operations, actions, components, parts, or combinations thereof disclosed in the specification, and are not intended to preclude the possibility that one or more other features, numbers, operations, actions, components, parts, or combinations thereof may exist or may be added.

Singular forms in the present disclosure are intended to include the plural forms as well, unless the context clearly indicates otherwise.

Hereinafter, exemplary embodiments of the present disclosure will be described in detail with reference to the accompanying drawings.

Figure 1:
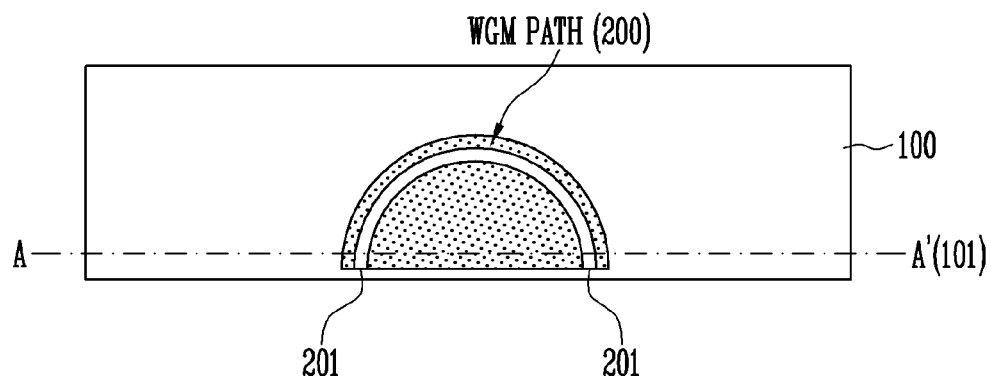
FIG. 1 is a view showing a structure of a resonator according to the present disclosure.

FIG. 1 is a view showing a structure of a resonator according to the present disclosure.

The resonator 100 according to the present disclosure, as shown in FIG. 1, has a whispering gallery mode (WGM) path 200 having a shape obtained by cutting in half a circular or ring-shaped resonator along a longitudinal axis, i.e., a semi-circular or semi-ring shape. An output signal is measured in a cutting plane 201 of the WGM path 200, thereby operating as an optical sensor.

In the semi-circular or semi-ring-shaped WGM path 200, beams advance while forming a WGM totally reflected along a circular arc. If the advancing beams reach the cutting plane 201, some of the beams are transmitted, thereby generating output beams, and the rest of the beams are reflected from the cutting plane 201 to return to the WGM path 200, thereby forming the entire resonator.

In a typical circular resonator, an input/output signal optically coupled by minutely approaching an optical waveguide within a range in which evanescent waves of the resonator are located should be measured, and a very fine adjustment of a few to a few hundreds of nm is required. Therefore, the Q-factor of the resonator is inevitably lowered due to its optical coupling state, and the resonator has unstable characteristics.

The resonator including the semi-circular or semi-ring-shaped WGM path 200 and the cutting plane 201 according to the present disclosure can more easily perform optical coupling to an optical waveguide, as compared with the typical circular resonator, and can maintain stable performance without lowering of the Q-factor due to an error in the optical coupling.

Figure 2:
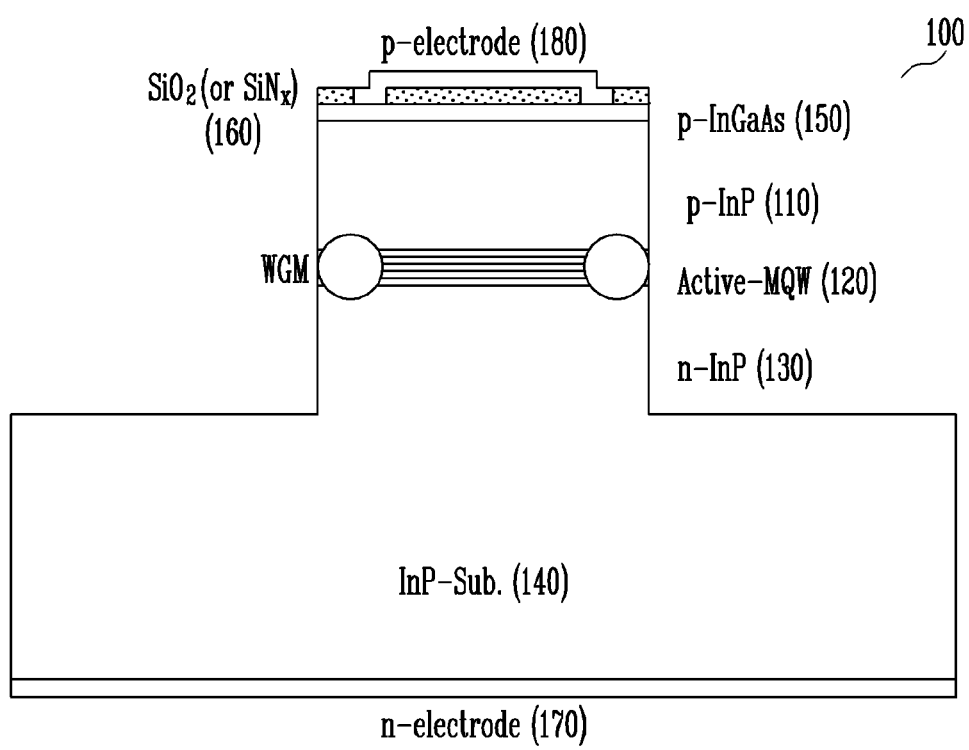
FIG. 2 is a sectional view when the resonator of FIG. 1 is viewed from plane A-A' 101.

FIG. 2 is a specific example of the present disclosure shown in FIG. 1, which shows a sectional view when a semi-circular laser resonator formed of an InP-based material is viewed from plane A-A' 101.

Referring to FIG. 2, the resonator 100 according to the present disclosure may be formed into a PIN-type semiconductor structure in which N—InP 130, an active region 120, P—InP 110, and P—InGaAs are sequentially epitaxial-grown on an InP substrate 140.

In the active region (waveguide) 120, first layers having a high bandgap energy and second layers having a low bandgap energy are alternately stacked, thereby having a plurality of quantum wells. The active region 120 is an active semiconductor waveguide that causes laser oscillation due to the occurrence of gains of beams waveguided therethrough. In an embodiment, the active region 120 may be configured as a multi-quantum-well (MQW).

In the present disclosure, the active region 120 is deeply etched down to a portion of the substrate 140 so as to have the cutting plane 201 of the semi-circular or semi-ring-shaped WGM path 200. Thus, beams generated in the active region 120 are totally reflected from the WGM path 200 to form a WGM, and is partially reflected from the cutting plane 201 to cause a resonance phenomenon. In addition, some of the beams are output such that an optical signal can be detected from an outside.

Semiconductor cladding layers (the N—InP 130 and the P—InP 110) having a higher energy than the active region 120 are formed on the top and bottom of the active region 120.

In FIG. 2, the structure of the resonator using a semiconductor laser using an InP/InGaAsP material system has been described as an example. However, it will be obvious to those skilled in the art that resonators manufactured using various material systems belong to the scope of the present disclosure as long as the structure of the semi-circular or semi-ring-shaped WGM path 200 is applied.

The resonator having the WGM path 200 according to the present disclosure is the same as a Fabry-Perot (FP) resonator in which a length of an optical path corresponds to a length of a circular arc(=$\pi$R, R is a radius of a circular arc). Here, R denotes a radius of the circular arc. However, unlike the FP resonator, the waveguide mode of the resonator according to the present disclosure is formed as an evanescent wave advancing along an etching plane of the circular arc. Hence, the resonator according to the present disclosure can operate as a laser having a characteristic in which the laser is sensitive to a detection target material attached to the etching plane.

When the WGM path 200 is a passive waveguide, the Q-factor of the resonator may be lowered due to the emission of beams from the cutting plane. Therefore, the resonator according to the present disclosure can have high utilization only when it is applied to an active resonator operating through laser oscillation caused by current injection. That is, in the resonator according to the present disclosure, the lowering of the Q-factor due to the emission of the beams from the cutting plane 201 is sufficiently recovered as an output is increased through laser oscillation, thereby ensuring a high Q-factor.

In various embodiments, a high reflective coating layer may be formed on the cutting plane 201 of the resonator. The high reflective coating layer increases the reflexibility of the cutting plane 201, so that an output loss can be reduced, thereby improving the Q-factor of the resonator. However, in this case, the Q-factor of the resonator may be lowered due to lowering of an optical output of the laser, and therefore, an optimal design of the resonator may be required.

Figure 3:
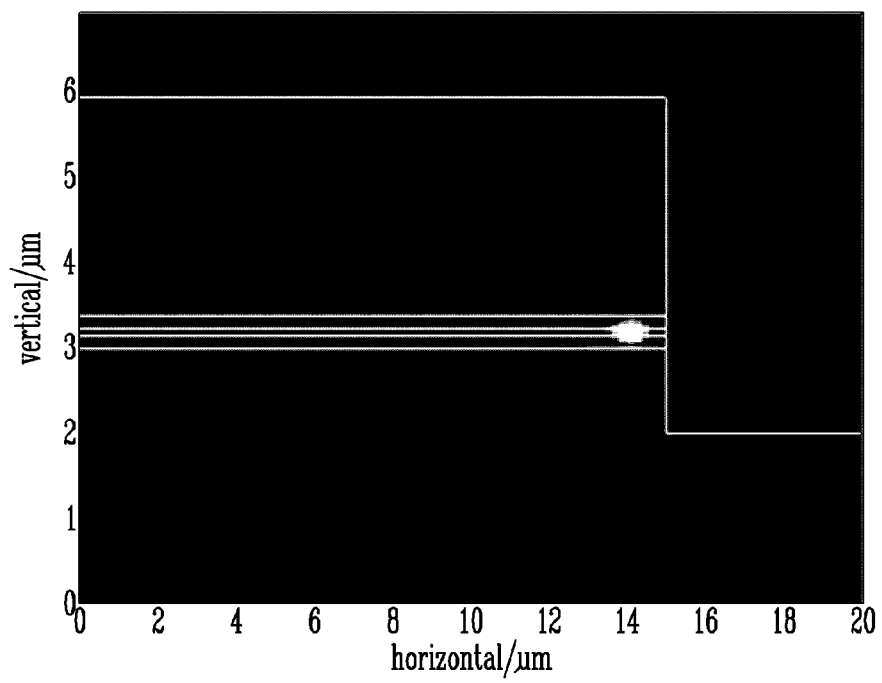
FIG. 3 is a graph showing a result obtained by performing a FIMMWAVE simulation on the resonator according to the present disclosure.

FIG. 3 is a graph showing a result obtained by performing a FIMMWAVE simulation on the resonator according to the present disclosure.

The graph of FIG. 3 shows a result obtained by performing a simulation on a semi-circular resonator formed of InP/InGaAsP as shown in FIGS. 1 and 2, using a FIMMWAVE simulator. According to FIG. 3, it can be seen that, in the semi-circular resonator, a WGM basis mode is formed close to an etching plane calculated by the FIMMWAVE simulator.

Figure 4:
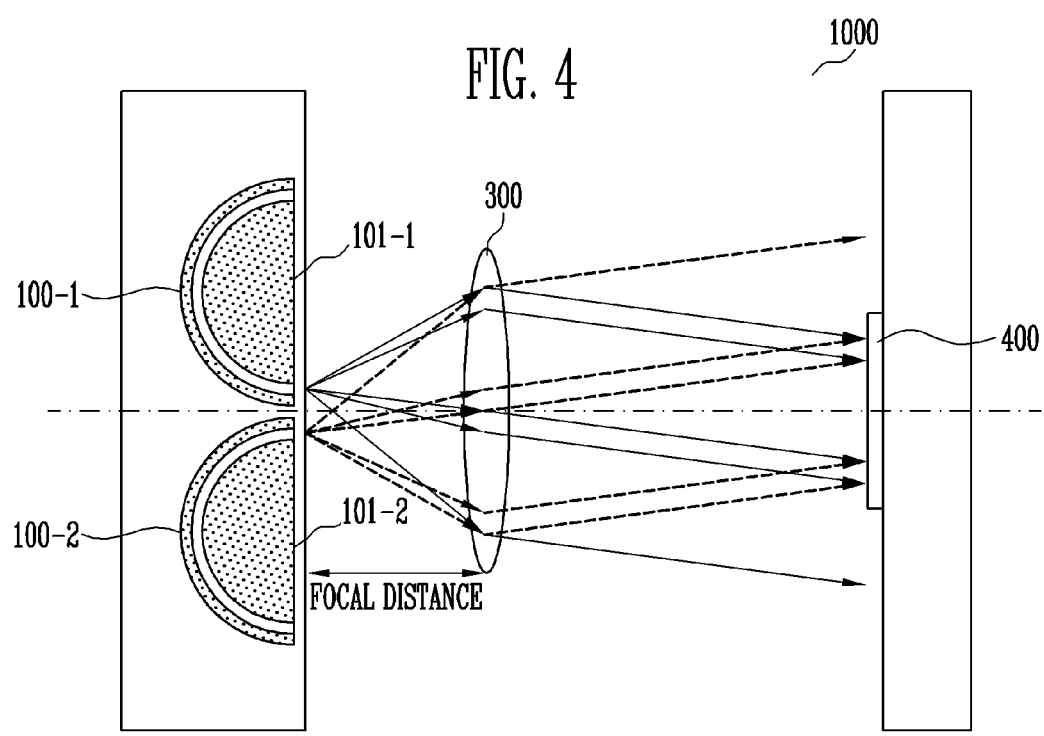
FIG. 4 is a view showing a structure of an optical sensor according to a first embodiment of the present disclosure.

FIG. 4 is a view showing a structure of an optical sensor according to a first embodiment of the present disclosure.

Referring to FIG. 4, the optical sensor 1000 according to the first embodiment of the present disclosure has a structure in which first and second resonator 100-1 and 100-2 according to the present disclosure are aligned in parallel such that cutting planes 101-1 and 101-2 face in the same direction. More specifically, the first and second resonator 100-1 and 100-2 are aligned such that the cutting planes 101-1 and 101-2 face an optical detector 400 which will be described later.

The aligned first and second resonators 100-1 and 100-2 are provided at a focal distance of a lens 300. The optical detector 400 is provided at the opposite side of the first and second resonators 100-1 and 100-2 with respect to the lens 300. The optical detector 400 may be provided at a position at which, as will be described below, beams that are output from the first and second resonators 100-1 and 100-2 and refracted while passing through the lens 300 reach the optical detector 400 while most frequently overlapping with each other.

The beams output from the first and second resonators 100-1 and 100-2 are refracted while passing through the lens 300. At this time, since the first and second resonators 100-1 and 100-2 are located at the focal distance of the lens 300, the beams output from the first and second resonators 100-1 and 100-2 are refracted as parallel beams while passing through the lens 300. A beating signal is formed by mutual interference generated as the parallel beams formed by being output from the first and second resonators 100-1 and 100-2 overlap with each other. The beating signal reaches the optical detector 400, and the optical detector 400 detects the beating signal. The optical detector 400 may measure whether a detection target material exists or characteristics of the detection target material according to characteristics of the detected signal.

In various embodiments, the optical sensor 1000 according to the first embodiment of the present disclosure may be configured such that the first resonator 100-1 operates as a reference laser and the second resonator 100-2 operates as a sensing laser. In this case, the optical sensor 1000 may perform detection on a material attached to a sidewall of the second resonator 100-2.

Figure 5:
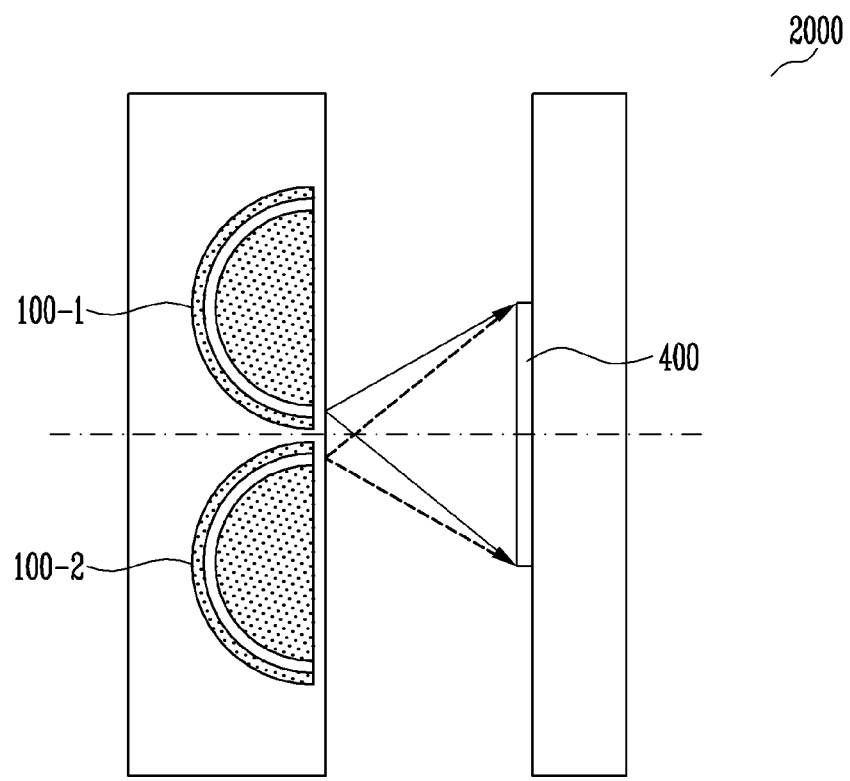
FIG. 5 is a view showing a structure in which a lens is removed from the optical sensor according to the first embodiment of the present disclosure.

In various embodiments, the optical sensor 1000 according to the first embodiment of the present disclosure may be configured as a more simplified optical sensor 2000 in which the lens 300 is removed as shown in FIG. 5. However, in this case, beams reaching the optical detector 400 are not the same phase wave, and therefore, the optical detector 400 detects a distorted beating signal.

Figure 6:
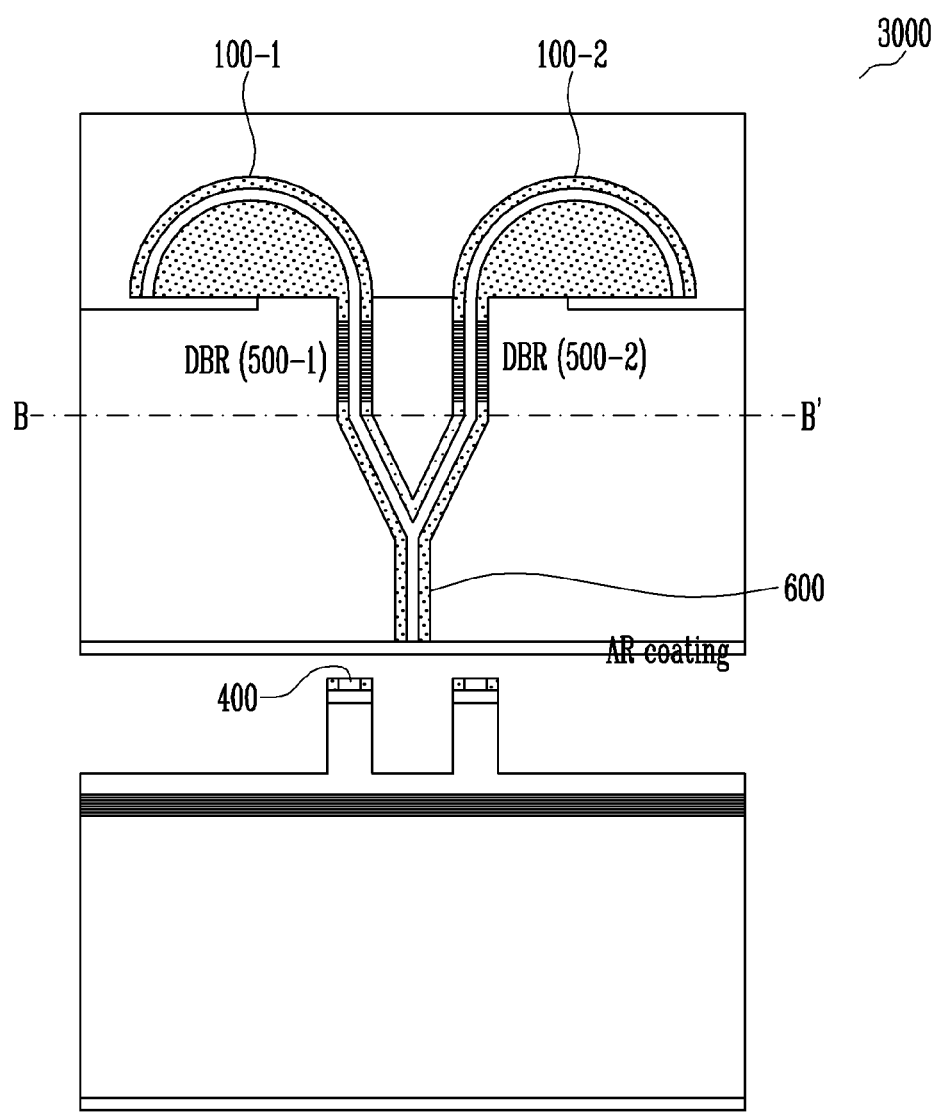
FIG. 6 is a view showing a structure of an optical sensor according to a second embodiment of the present disclosure.

FIG. 6 is a view showing a structure of an optical sensor according to a second embodiment of the present disclosure.

Referring to FIG. 6, as compared with the optical sensor 1000 according to the first embodiment, the optical sensor 3000 according to the second embodiment of the present disclosure may include, instead of the lens 300, first and second distributed Bragg reflectors (hereinafter, referred to as DBRs) 500-1 and 500-2 and a Y-shaped coupler 600.

In the optical sensor 3000 according to the second embodiment of the present disclosure, the first and second DBR 500-1 and 500-2 are integrated such that the cutting plane 101-1 or 101-2 of one of the first and second resonators 100-1 and 100-2 is etched down to the substrate 140, thereby forming a reflection plane, and the cutting plane 101-1 or 101-2 of the other of the first and second resonators 100-1 and 100-2, which detects output beams performs reflection caused by the DBRs, instead of reflection caused by etching. Beams output from the first and second resonators 100-1 and 100-2 formed including reflection of the first and second DBRs 500-1 and 500-2 pass through the first and second DBRs 500-1 and 500-2 and are coupled to each other in the Y-shaped coupler 600, thereby generating a beating signal caused by mutual interference.

The generated beating signal reaches the optical detector 400, and the optical detector 400 detects the beating signal.

According to the above-described configuration, the optical sensor 3000 according to the second embodiment of the present disclosure can generate a beating signal through more stabilized single mode oscillation.

Figure 7:
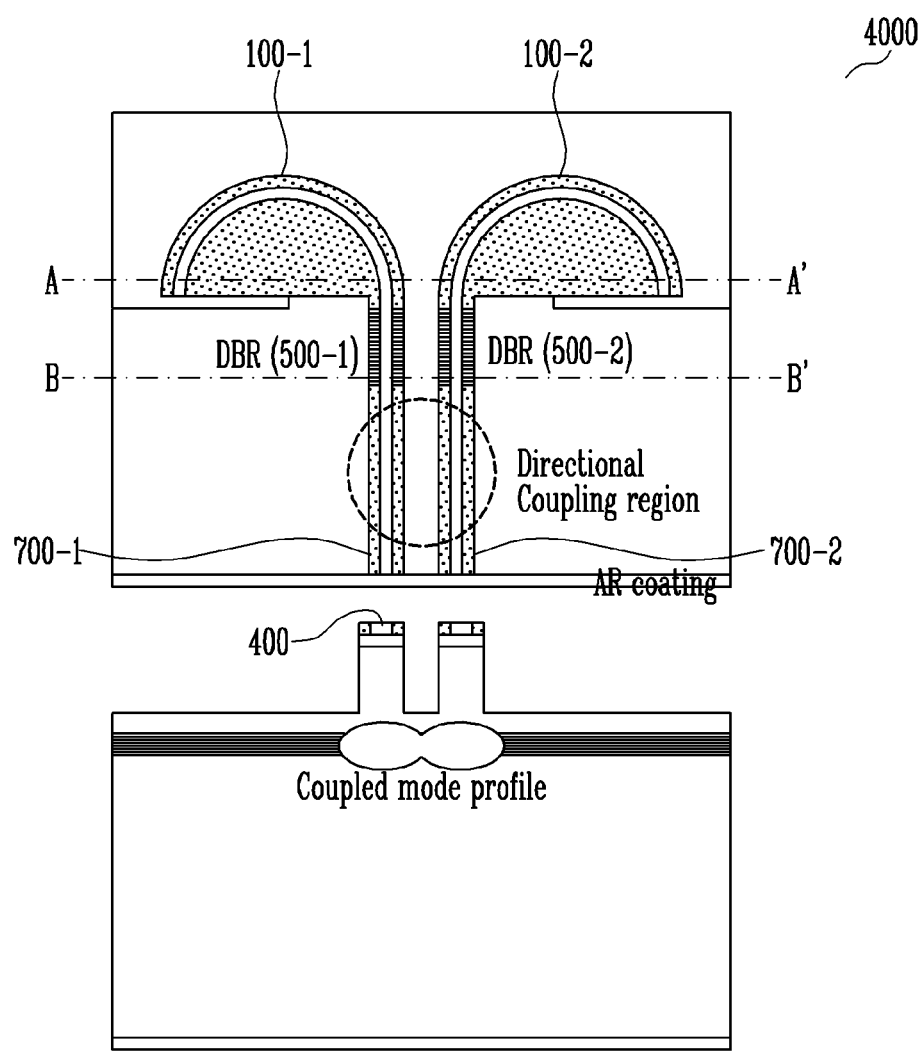
FIG. 7 is a view showing a structure of an optical sensor according to a third embodiment of the present disclosure.

FIG. 7 is a view showing a structure of an optical sensor according to a third embodiment of the present disclosure.

Referring to FIG. 7, as compared with the optical sensor 3000 according to the second embodiment, the optical sensor 4000 according to the third embodiment of the present disclosure may include directional couplers 700-1 and 700-2, instead of the Y-shaped coupler 600.

In various embodiments, the directional couplers 700-1 and 700-2 may be formed as shallow ridge waveguides. Here, the shallow ridge waveguides have a length for achieving optical coupling that is about 50% with respect to beams output from the first and second resonators 100-1 and 100-2, and may be disposed at a distance for achieving the optical coupling.

The directional couplers 700-1 and 700-2 are integrated at ends of the first and second diffraction grids 500-1 and 500-2. At this time, beating signals of beams are output from first and second waveguides 700-1 and 700-2 of the directional couplers 700-1 and 700-2, respectively. The generated beating signals reach the optical detector 400, and the optical detector 400 detects the beating signals.

In various embodiments, a beating signal caused by optical coupling that is 50% of that in one shallow ridge waveguide is output from only any one of the first and second waveguides 700-1 and 700-2 of the directional couplers 700-1 and 700-2, and a modified shallow ridge waveguide may be applied to the other shallow ridge waveguide such that a beating signal is scattered or absorbed at an end portion of the other shallow ridge waveguide.

According to the present disclosure, it is possible to overcome a limit of high resolution and high sensitivity of typical resonators and to improve the high resolution and the high sensitivity.

Also, according to the present disclosure, it is possible to implement a semiconductor laser sensor that is relatively simply manufactured and driven.

Also, according to the present disclosure, it is possible to provide an original technology capable of solving the complexity and instability of a system, which interrupts commercialization of the existing optical sensors, and commercializing a low-priced optical sensor system.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. An optical sensor comprising:
    first and second resonators each formed to have a shape in which a waveguide is etched in a semi-circular or semi-ring shape from a section thereof;
    an optical detector for detecting a beating signal caused by interference of two output beams output from the first and second resonators; and
    a lens for refracting the two output beams, thereby outputting two parallel beams.

2. The optical sensor of claim 1, wherein the first and second resonators are located at a focal distance of the lens.

3. The optical sensor of claim 1, wherein the first resonator operates as a reference resonator, and
    the second resonator operates as a sensing resonator.

4. The optical sensor of claim 1, wherein the first and second resonators are aligned in parallel such that the section faces the optical detector.

5. The optical sensor of claim 1, wherein each of the first and second resonators includes a high reflective coating layer formed on the section.

6. The optical sensor of claim 1, wherein the two output beams are some of beams incident into the first resonator to form a whispering gallery mode (WGM), which are output through the section of the semi-circular or semi-ring-shaped waveguide.

7. An optical sensor comprising:
    first and second resonators each formed to have a shape in which a waveguide is etched in a semi-circular or semi-ring shape from a section thereof;
    an optical detector for detecting a beating signal caused by interference of two output beams output from the first and second resonators;
    two DBRs integrated with the section to receive two output beams; and
    a coupler for coupling beams output from the two DBRs, thereby outputting the beating signal.

8. The optical sensor of claim 7, wherein the coupler includes a Y-shaped coupler or directional coupler.

9. The optical sensor of claim 8, wherein the plurality of directional couplers are configured as shallow ridge waveguides.

10. The optical sensor of claim 8, wherein the directional coupler are provided with a length at a distance, corresponding to optical coupling that is 50% of that of beams respectively output from two DBRs.

11. The optical sensor of claim 8, wherein the directional coupler include:
    one waveguide of the directional coupler for outputting the beating signal of a beam output from a first diffraction grid; and
    another waveguide of the directional coupler configured as a modified waveguide such that the beating signal of a beam output from a second diffraction grid is scattered or absorbed.

12. The optical sensor of claim 7, wherein each of the first and second resonators includes a high reflective coating layer formed on the section.

13. The optical sensor of claim 7, wherein the two output beams are some of beams incident into the first resonator to form a WGM, which are output through the section of the semi-circular or semi-ring-shaped waveguide.

* * * * *